(12) United States Patent
Song et al.

(10) Patent No.: US 6,487,472 B1
(45) Date of Patent: Nov. 26, 2002

(54) SEMICONDUCTOR DEVICE MANUFACTURING FACILITY WITH A DIAGNOSIS SYSTEM

(75) Inventors: Jae-kwan Song, Suwon (KR); Hoon Cha, Suwon (KR); Yoo-keun Won, Suwon (KR); Dong-cheol Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/299,565

(22) Filed: Apr. 27, 1999

(30) Foreign Application Priority Data

Apr. 28, 1998 (KR) .............................................. 98-15200

(51) Int. Cl.[7] .............................................. G06F 19/00
(52) U.S. Cl. .......................................... 700/121; 700/1
(58) Field of Search ........................... 700/1, 108, 109, 700/121

(56) References Cited

U.S. PATENT DOCUMENTS 5,726,912 A * 3/1998 Krall, Jr. et al. ............ 702/186

* cited by examiner

Primary Examiner—Thomas Black
Assistant Examiner—Ronald D Hartman, Jr.
(74) Attorney, Agent, or Firm—Volentine Francos, PLLC

(57) ABSTRACT

A facility for manufacturing semiconductor devices is provided with a diagnosis system for easily monitoring the operation states of various fabrication systems, and controlling them in case of abnormal operation states by means of a sensing signal from the fabrication systems and a control signal from a control system. The fabrication system outputs a sensing signal showing the operation states of the fabrication processes such as temperature, time, pressure, concentration, power, etc. The control system outputs a control signal to the fabrication systems for controlling their operation states via transmit lines connected thereto according to the sensing signal from the fabrication systems or an input signal from a host computer. The diagnosis system analyzes the sensing signal from the fabrication systems and the control signal from the control system so as to assess the operation states of the fabrication systems. The control system and the diagnosis system are connected to a LAN (Local Area Network) connected to a communication modem, and the fabrication systems are diagnosed via a communication network.

26 Claims, 15 Drawing Sheets

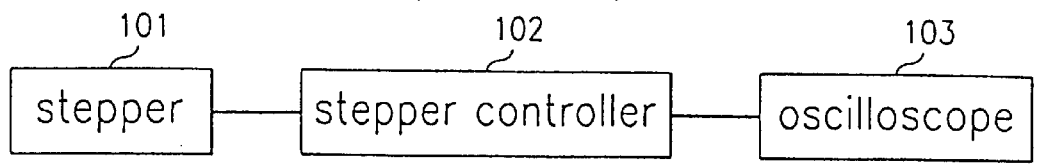
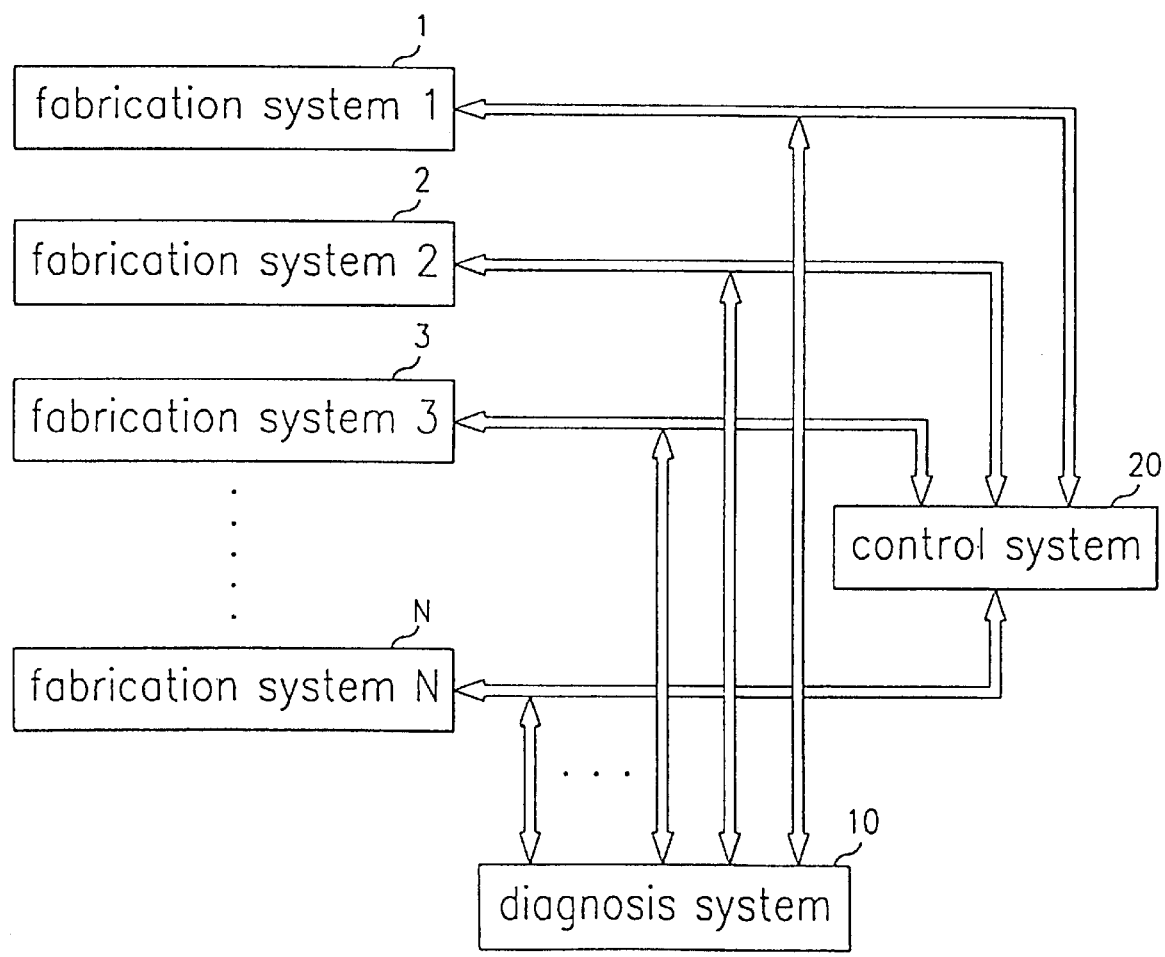

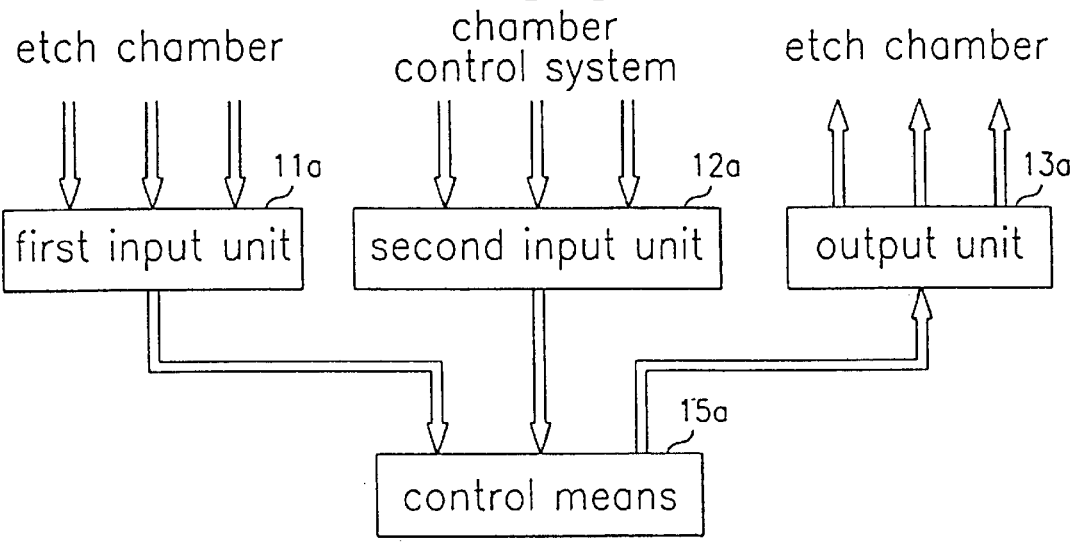
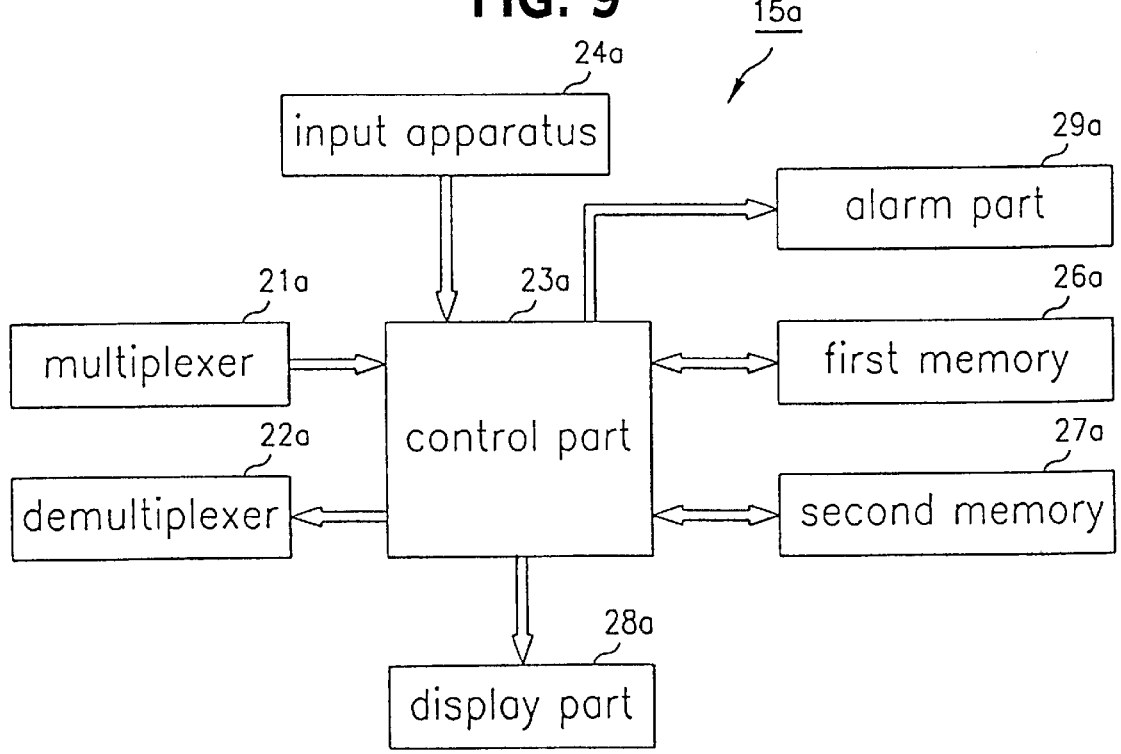

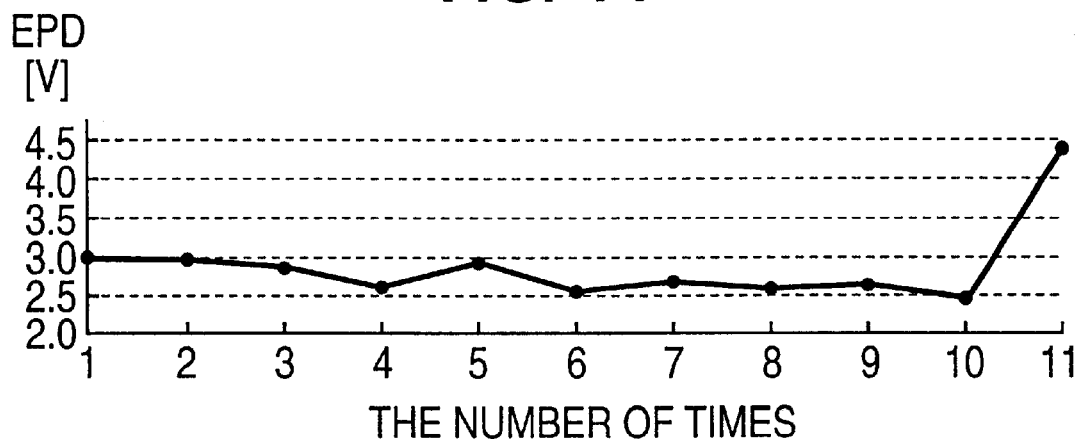
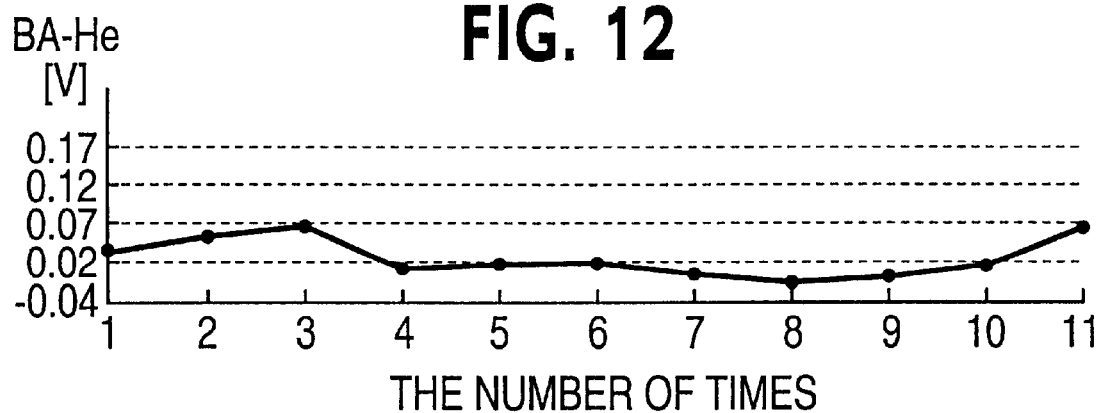

SEMICONDUCTOR DEVICE MANUFACTURING FACILITY WITH A DIAGNOSIS SYSTEM

BACKGROUND OF THE INVENTION

1. Field of the Invention

The present invention relates to a semiconductor device manufacturing facility, and more particularly, to a semiconductor device manufacturing facility with a diagnosis system for controlling the operation state of each fabrication system within the facility according to a corresponding process and its operation state, by connecting the diagnosis system with the fabrication systems via a connector and a communication network.

2. Background of the Related Art

Typically, semiconductor device fabrication involves many processes including oxidation, deposition, ion-implantation, photo-etch, inspection, etc. Each of the above processes is becoming automated using statistical process control (SPC) techniques.

Using SPC, processing data for a specific facility is control-managed, and any abnormality of the facility or the process can be detected using accumulated statistical data. Each fabrication facility has a method of monitoring the processing data which is processed therein. The data from the monitoring is used to establish control limits for regularly inspecting various kinds of fabrication facilities, or for detecting and correcting an abnormal operation in a fabrication facility.

Conventionally, data monitoring has been done by a control facility within the fabrication facility. In the meantime, data monitored during processing must be continuously collected and loaded into the control facility, so that the control limits can be continuously updated. The data collected in this manner is essential for controlling the fabrication facility during its operation, but it is difficult to detect the process flow using the parameters needed by an operator while the process is going on in real time.

FIG. 1 shows one embodiment of a conventional data monitoring arrangement in which an oscilloscope 103 is connected to a stepper controller 102 of a stepper 101 so as to temporarily monitor the operation state of an exposure facility in order to detect any abnormality. While the stepper 101 is operated, the signal output from the stepper controller 102 is shown using the oscilloscope 103. However, it is difficult to detect the point at which the abnormality occurs in the facility just by seeing the monitored data. That is, the data are not analyzed, and it is difficult to establish control limits. Therefore, it is difficult to efficiently control-manage the facilities, and to monitor the fabrication facility in real time.

Therefore, additional computational and analytical steps must be carried out in order to read/understand the monitored data.

SUMMARY OF THE INVENTION

The present invention is directed to a facility for manufacturing semiconductor devices provided with a diagnosis system for easily monitoring the operation states of various fabrication systems, and controlling them in case of abnormal operation states by means of a sensing signal from the fabrication systems and a control signal from a control system, which substantially overcomes one or more of the problems due to the limitations and the disadvantages of the related art.

Another object of the present invention is to provide a facility for manufacturing semiconductor devices with a diagnosis system allowing for a remote operator to monitor the operation states of the fabrication systems, and control them remotely by interconnecting the control system and the fabrication systems by a communication network.

A further object of the present invention is to provide an etch facility with a diagnosis system for monitoring the operation state of an etch chamber and efficiently controlling it in case of an abnormal operation state by providing a diagnosis system to the etch chamber.

A further object of the present invention is to provide an exposure facility with a diagnosis system for monitoring the operation state of an exposure system and efficiently controlling it in case of an abnormal operation state by providing a diagnosis system to the exposure system.

To achieve these and other advantages, and in accordance with the purpose of the present invention as embodied and broadly described, the facility for manufacturing semiconductor devices comprises a plurality of fabrication systems for carrying out fabrication processes for manufacturing semiconductor devices including oxidation, deposition, diffusion, ion-implantation, photo-etch, etc., and outputting a sensing signal showing the operation states of the fabrication processes such as temperature, time, pressure, concentration, power, etc. A control system outputs a control signal to the fabrication systems for controlling their operation states via transmit lines connected thereto according to the sensing signal from the fabrication systems or an input signal from a host computer. A diagnosis system analyzes the sensing signal from the fabrication systems and the control signal from the control system so as to assess the operation states of the fabrication systems. The sensing signal can be signals output from a specific board constituted within the various fabrication facilities, and can be signals output from a specific output port of the facility.

The diagnosis system comprises an input unit for receiving a sensing signal from the fabrication systems indicating the operation states of the systems, and a control signal from the control system. An output unit outputs a control signal for controlling the operation states of the fabrication systems according to the sensing signal therefrom. A control means analyzes the sensing signal received by the input unit, assesses the operation state of each fabrication system, and applies a control signal for controlling the operation state of the fabrication system.

The input unit comprises a first input unit with a plurality of input ports for receiving a sensing signal from the fabrication systems indicating the operation state of the fabrication systems; and a second input unit with a plurality of input ports for receiving a control signal from the control system for controlling the operation state of the fabrication systems.

The control means of the diagnosis system comprises a control part for analyzing the operation state of the fabrication systems with a sensing signal from the fabrication systems and a control signal from the control system, and applying a control signal corresponding thereto. A multiplexer selectively transfers the control signal from the control system and the sensing signal from the fabrication systems, which are received via the input unit, to the control part. A first memory device stores the data for the operation state of the fabrication systems. A display part displays the operation state of the fabrication systems analyzed by the control part. A demultiplexer selectively applies the control signal, which is applied from the control part corresponding to the operation state of the fabrication system, to the fabrication systems.

Preferably, the control means further comprises a channel select part for selecting at least one fabrication system among the plurality of fabrication systems, an alarm part for outputting an alarm signal in case of an abnormal operation state of a specific fabrication system, an input apparatus for receiving programs or data from a storage medium which stores, various programs or data, and a second memory device having a program for performing multi-tasking therein so as to control the operation state of the fabrication systems both by the control system and the diagnosis system.

The diagnosis system is connected to the plurality of fabrication systems via a transmit line having a connector, which is able to be connected/disconnected.

In addition, the control system and the diagnosis system are respectively connected to a LAN (Local Area Network) connected to a communication modem, and the fabrication systems are diagnosed via the communication network. The control system and the diagnosis system are respectively connected to a LAN to which a communication modem connected to an Internet (or Wide Area Network (WAN)) is connected, and the fabrication systems are monitored using the Internet.

Preferably, a diagnostic program for controlling the operation of the fabrication systems is provided with a personal computer by which the operation state of the various control systems can be remote-monitored and remote-controlled.

In another aspect of the present invention, an etch system for manufacturing semiconductor devices with a diagnosis system comprises an etch chamber for carrying out an etch process for manufacturing semiconductor devices. A chamber control system outputs a control signal for controlling the etch process and the operation of the etch chamber according to a sensing signal from the etch chamber and an input signal from a host computer. A diagnosis system receives a control signal for controlling the etch process and the operation state of the etch chamber and a sensing signal showing the etch process and the operation state of the etch chamber, diagnoses the etch process and the operation state of the etch chamber, and outputs a control signal to the etch chamber according thereto.

The etch chamber comprises a MFC (Mass Flow Controller) for sensing/controlling the amount of the process gas supplied to the etch chamber, a pressure gauge for sensing the pressure inside the etch chamber, and a power supply source for applying power to the etch chamber.

The diagnosis system comprises an input unit for receiving a sensing signal from the etch chamber indicating the operation state of the etch process and the operation state of the etch chamber, and a control signal from the chamber control system. An output unit outputs a control signal for controlling the operation state of the etch chamber according to the sensing signal therefrom. A control means analyzes the sensing signal received by the input unit, assesses the operation state of the etch chamber, and applies a control signal for controlling the operation of the etch chamber.

The input unit comprises a first input unit with a plurality of input ports for receiving a sensing signal from the etch chamber indicating the operation state of the etch chamber; and a second input unit with a plurality of input ports for receiving a control signal from the chamber control system for controlling the operation state of the etch chamber.

The control means comprises a control part for analyzing the operation state of the etch chamber with a sensing signal from the etch chamber and a control signal from the chamber control system, and applying a control signal according thereto. A multiplexer selectively transfers the control signal from the chamber control system and the sensing signal from the etch chamber, which are received via the input unit, to the control part. A first memory device stores the data for the operation state of the etch chamber, and a display part displays the operation state of the etch chamber analyzed by the control part. A demultiplexer selectively applies the control signal, which is applied from the control part corresponding to the operation state of the etch chamber.

The control means further comprises an alarm part for outputting an alarm signal in case of an abnormal operation state of the etch chamber; and a second memory device having a program for performing multi-tasking therein so as to control the operation state of the etch chamber both by the chamber control system and the diagnosis system.

In addition, the chamber control system and the diagnosis system are respectively connected to a LAN (Local Area Network) connected to a communication modem, and the etch chamber is diagnosed via a communication network.

The chamber control system and the diagnosis system are respectively connected to a LAN to which a communication modem connected to an Internet (or WAN) is connected, and the etch chamber is monitored using the Internet.

Preferably, a diagnostic program for controlling the operation of the etch chamber is provided with a personal computer by which the operation state of the etch chamber can be remote-monitored and remote-controlled.

In another aspect of the present invention, a fabrication facility for manufacturing semiconductor devices with a diagnosis system comprises an exposure system for carrying out an exposure process for manufacturing semiconductor devices, and an exposure control system for outputting a control signal for controlling the exposure process and the operation of the exposure system according to a sensing signal from the exposure system and an input signal from a host computer. A diagnosis system receives a control signal for controlling the exposure process and the operation state of the exposure system and a sensing signal showing the exposure process and the operation state of the exposure system, diagnoses the exposure process and the operation state of the exposure system, and outputs a control signal to the exposure system according thereto.

The exposure system comprises a driving part for driving a stage having a wafer mounted thereon by two motors back/forth and right/left, an aligning part for aligning the wafer mounted on the stage to a certain location, and an exposure part for carrying out an exposure process for the wafer mounted on the stage.

The diagnosis system comprises: an input unit for receiving a sensing signal from the exposure system indicating the state of the exposure process and the operation state of the exposure system and a control signal from the exposure control system; an output unit for outputting a control signal for controlling the operation state of the exposure system according to the sensing signal therefrom; and a control means for analyzing the sensing signal received by the input unit, assessing the operation state of the exposure system, and applying a control signal for controlling the operation of the exposure system.

The input unit comprises a first input unit with a plurality of input ports for receiving a sensing signal from the exposure system indicating the operation state of the exposure system; and a second input unit with a plurality of input ports for receiving a control signal from the exposure control system for controlling the operation state of the exposure system. The control means comprises a control part for analyzing the operation state of the exposure system with a sensing signal from the exposure system and a control signal from the exposure control system and applying a control signal according thereto. A multiplexer selectively transfers the control signal from the exposure control system and the sensing signal from the exposure system, which are received via the input unit, to the control part. A first memory device stores the data for the operation state of the exposure system. A display part displays the operation state of the exposure system analyzed by the control part, and a demultiplexer selectively applies the control signal to the exposure system, which is applied from the exposure control part corresponding to the operation state of the exposure system.

Preferably, the control means further comprises an alarm part for outputting an alarm signal in case of an abnormal operation state of the exposure system, and a second memory device having a program for performing multi-tasking therein so as to control the operation state of the exposure system both by the exposure control system and the diagnosis system.

In addition, the exposure control system and the diagnosis system are respectively connected to a LAN (Local Area Network) connected to a communication modem, and the exposure system is diagnosed via the communication network. The exposure control system and the diagnosis system are respectively connected to a LAN to which a communication modem connected to an Internet (or WAN) is connected, and the exposure system is diagnosed using the Internet.

Preferably, a diagnostic program for controlling the operation of the exposure system is provided with a personal computer by which the operation state of the various control systems can be remote-monitored and remote-controlled.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate an embodiment of the invention, in which:

FIG. 1 is a schematic diagram showing a conventional stepper connected with a stepper controller and an oscilloscope;

FIG. 2 is a schematic block diagram showing one embodiment of a semiconductor device manufacturing facility with a diagnosis system according to the present invention;

Figure 4:
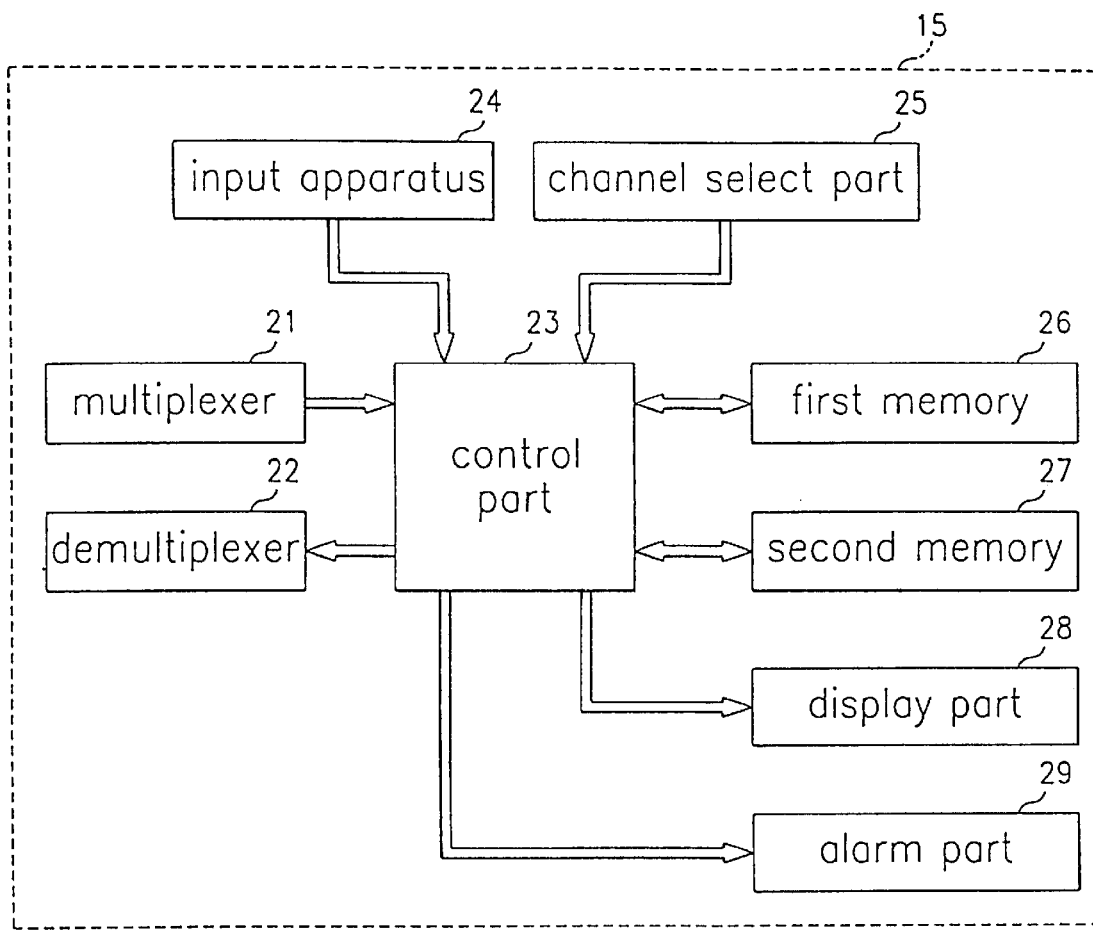
Figure 5:
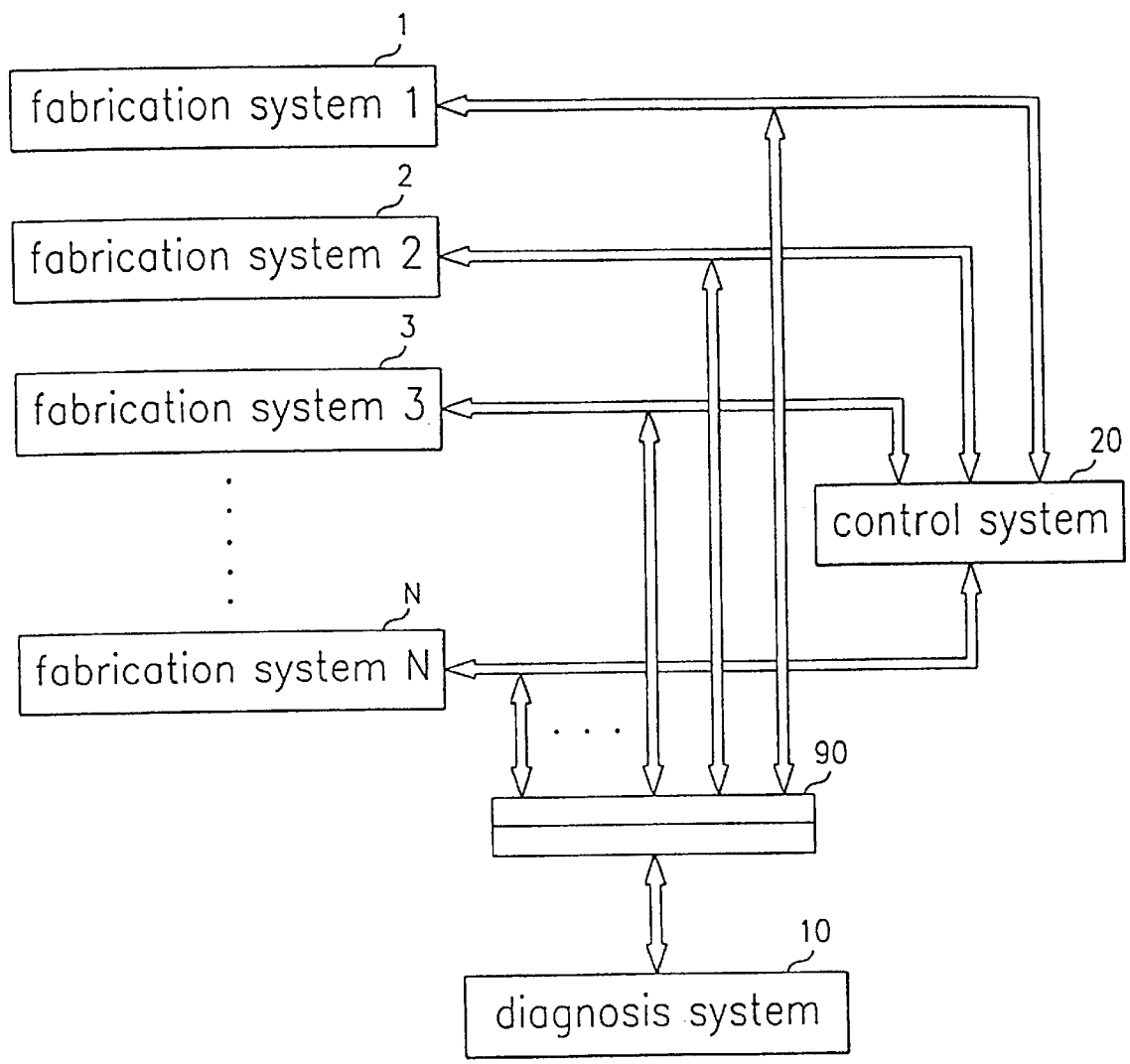
Figure 6:
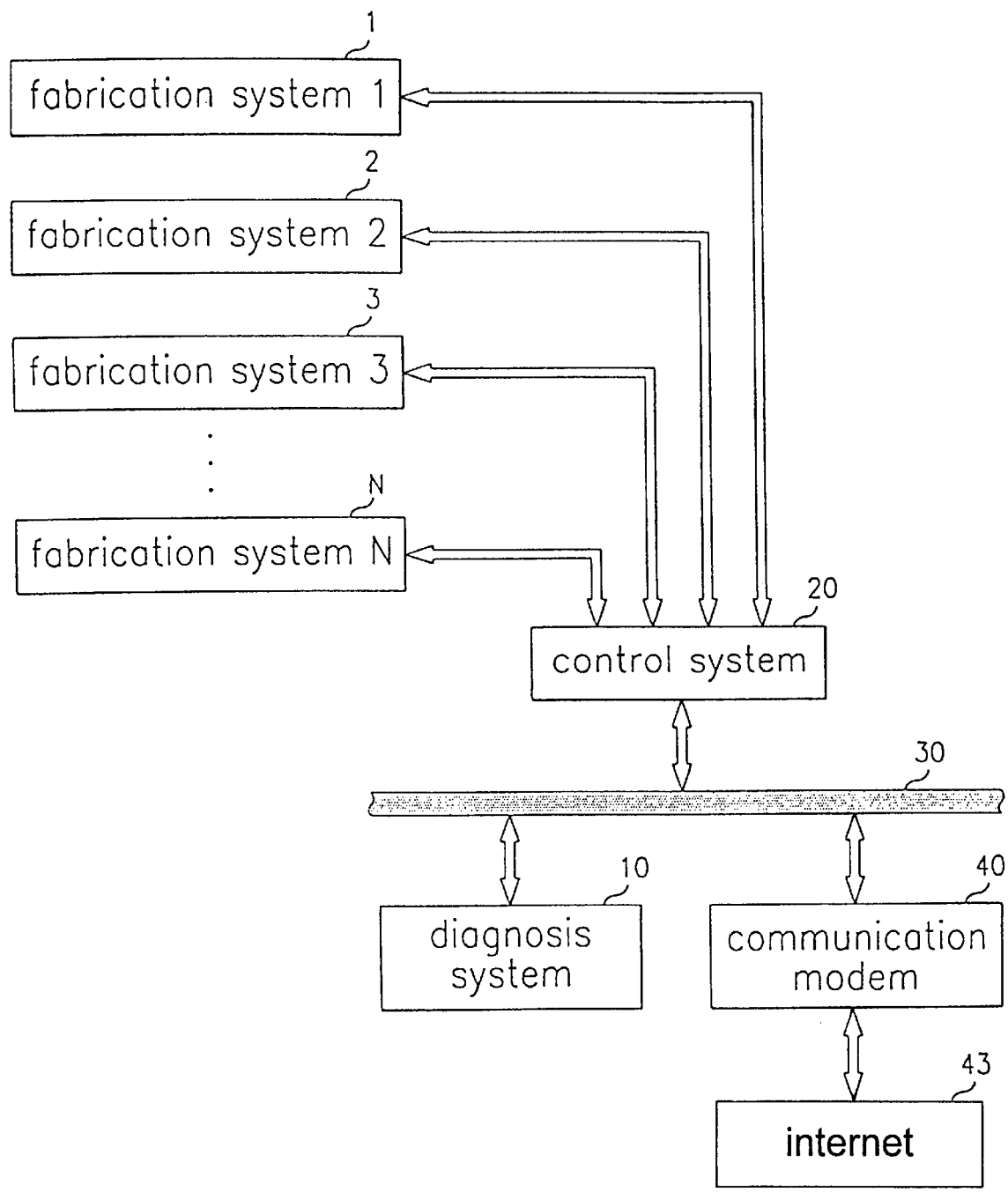
Figure 7:
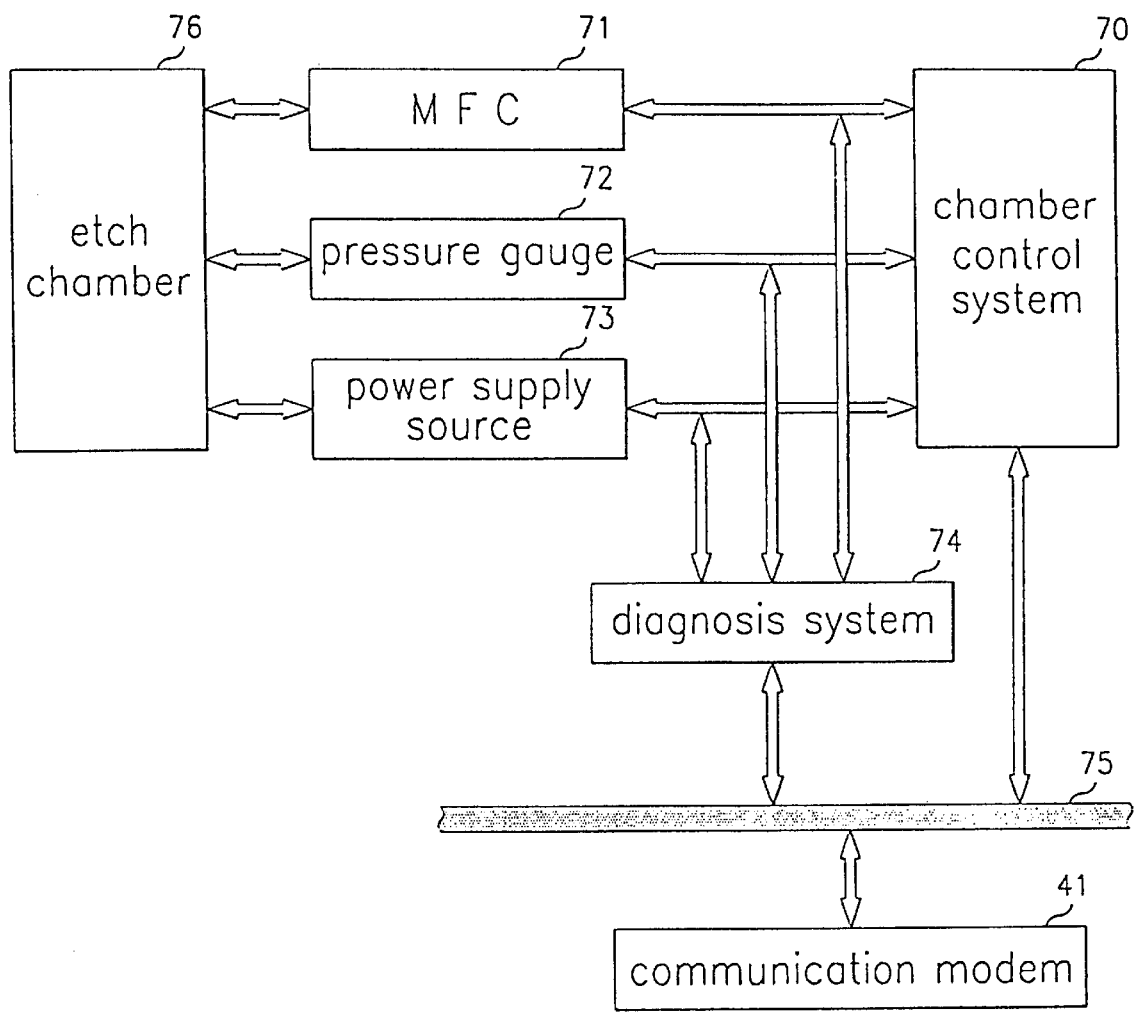
Figure 10:
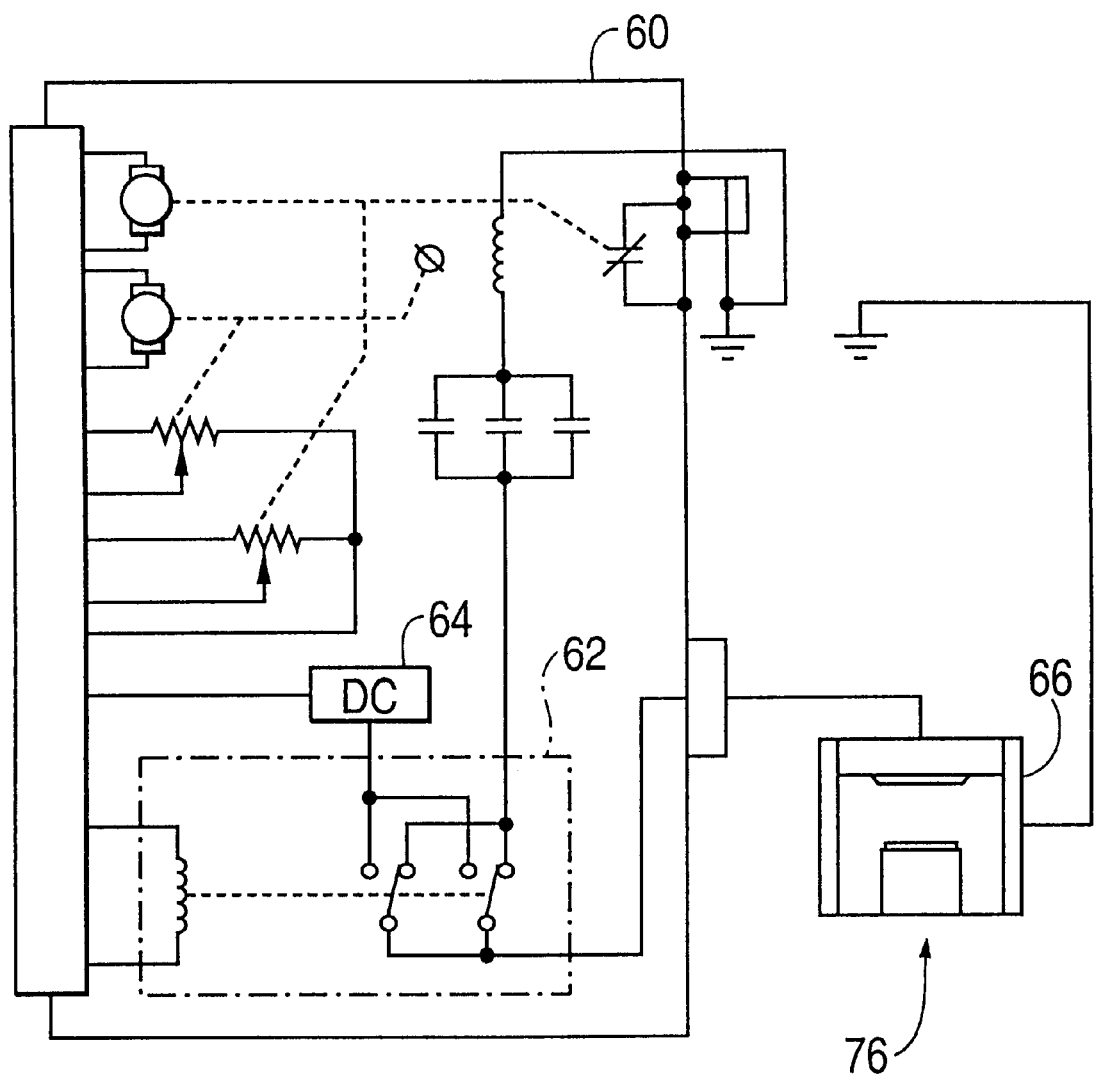
Figure 13:
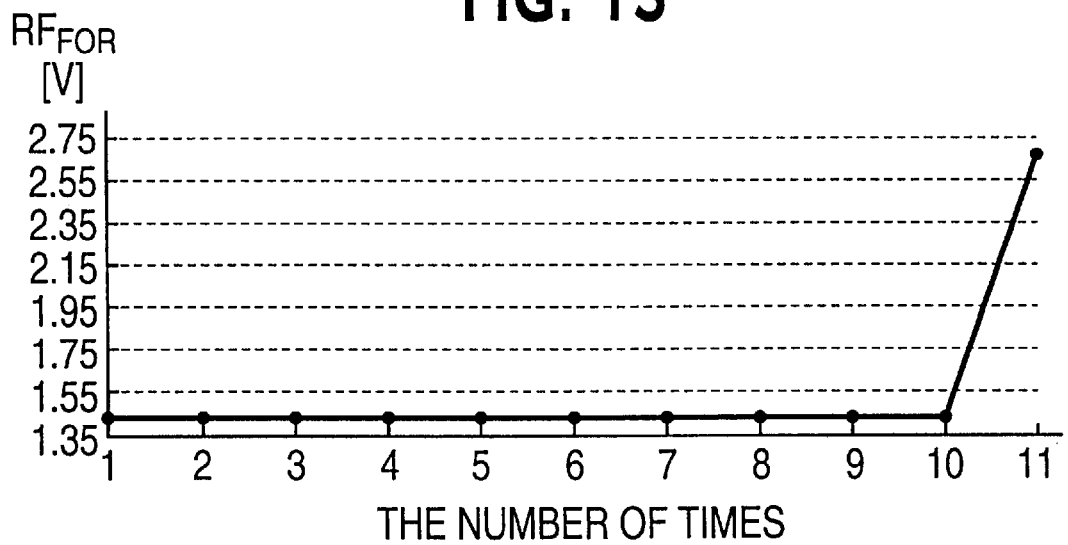
Figure 14:
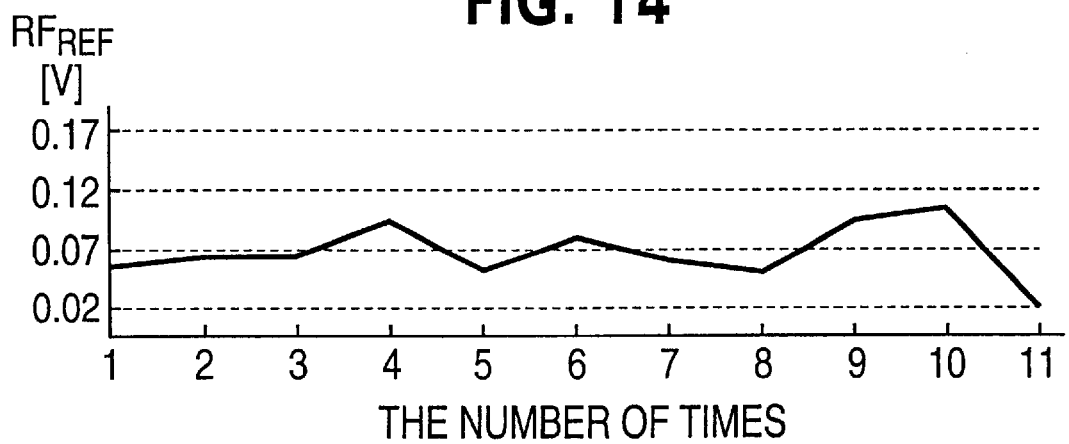
Figure 15:
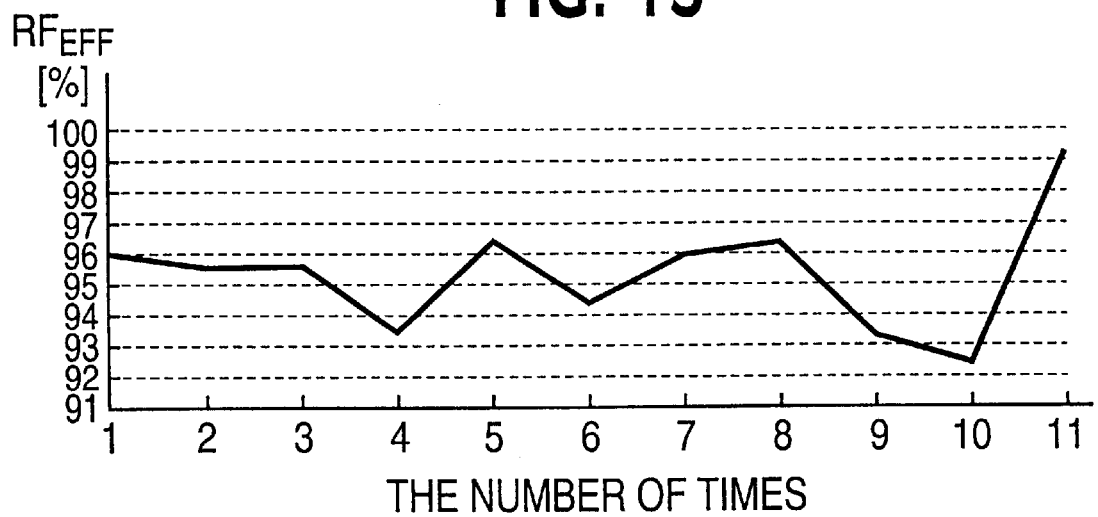
Figure 16:
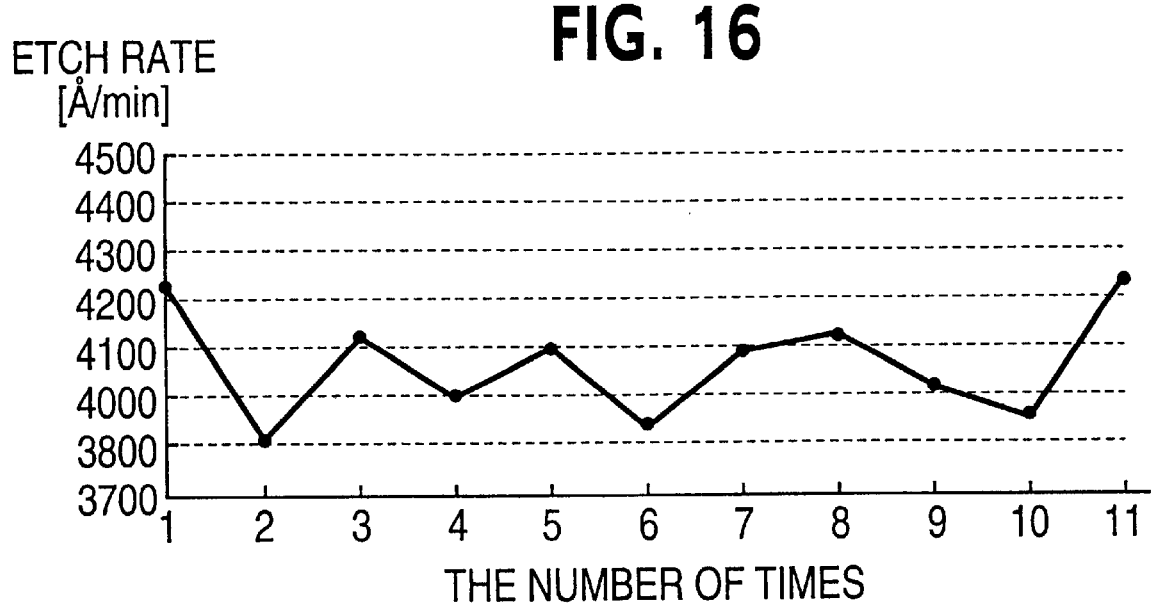
Figure 17:
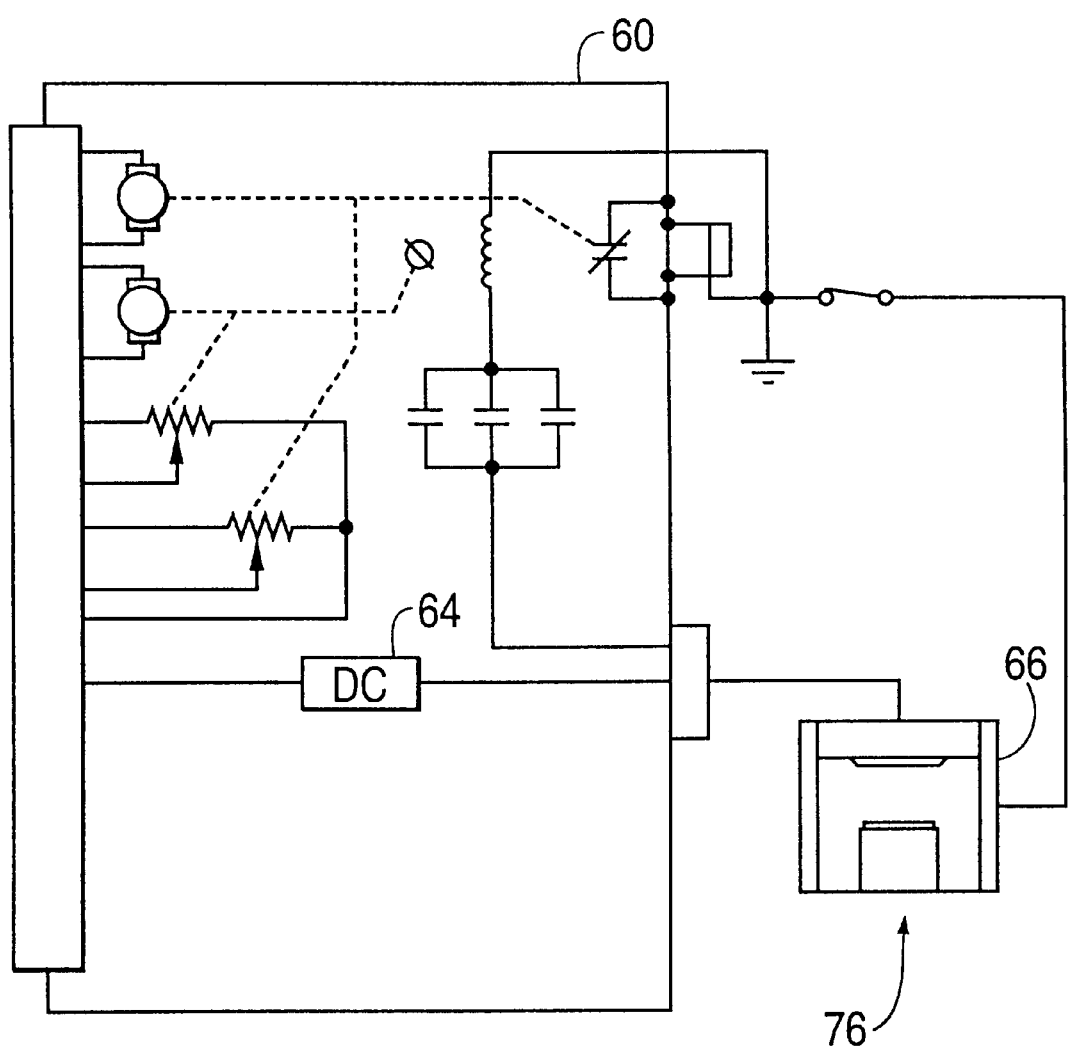
Figure 18:
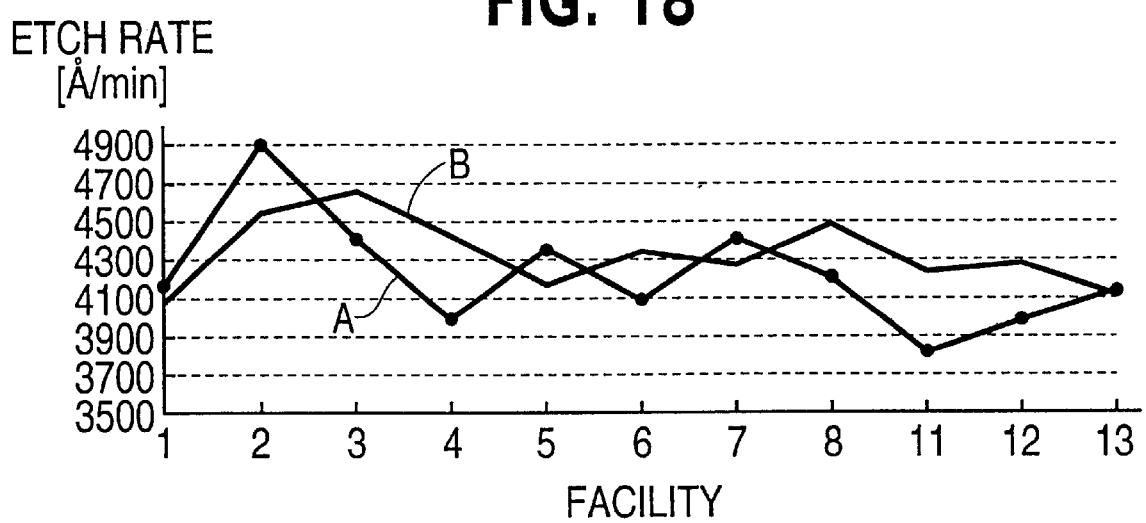
Figure 19:
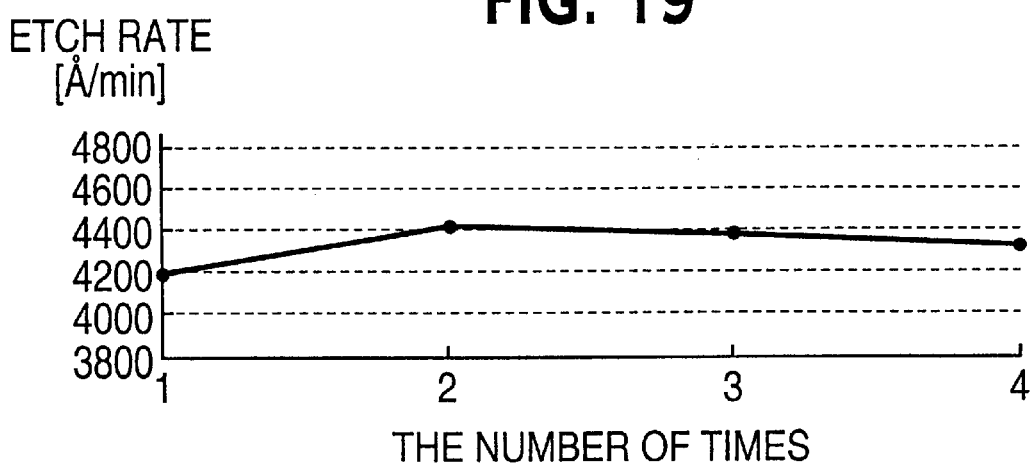
Figure 20:
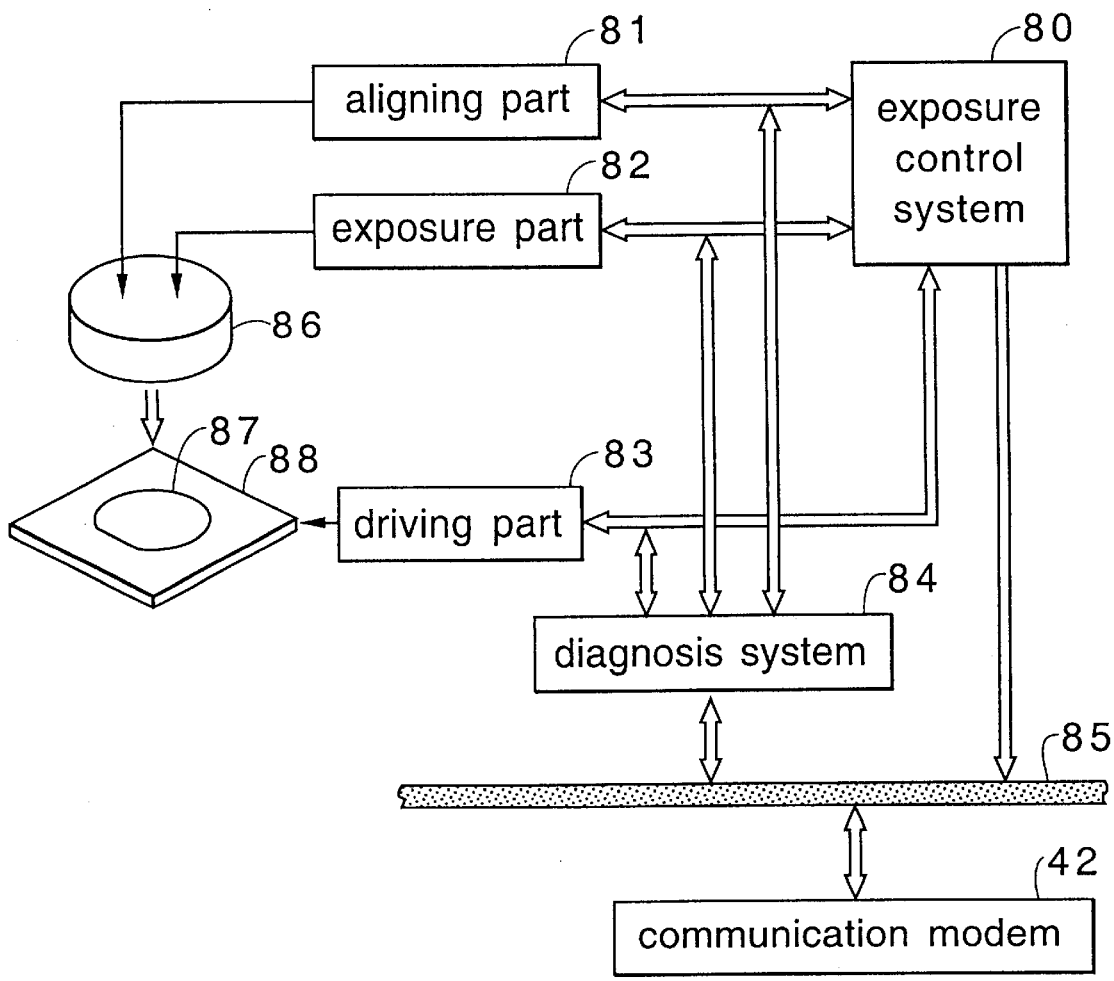
Figure 21:
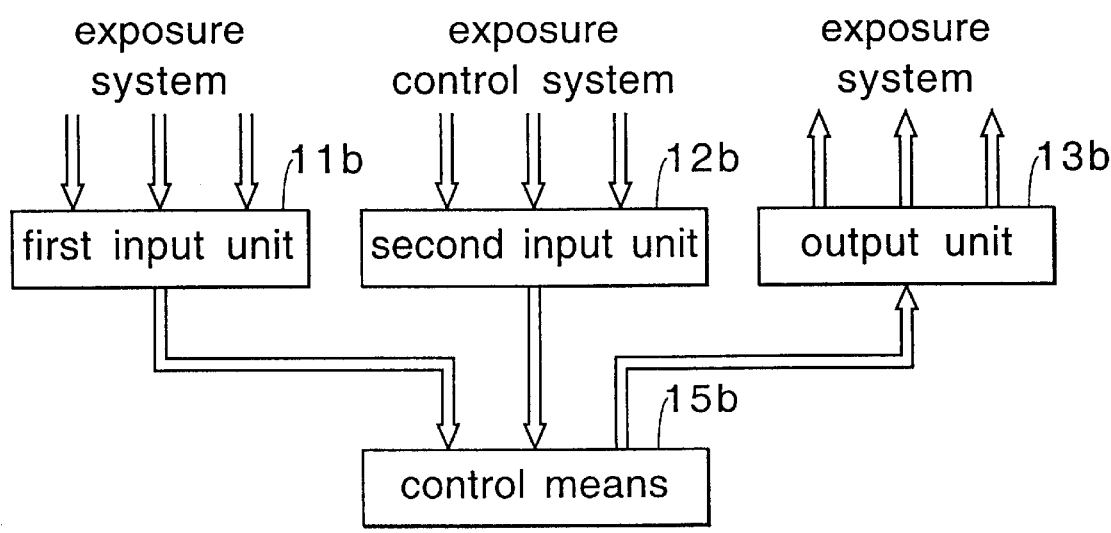
Figure 22:
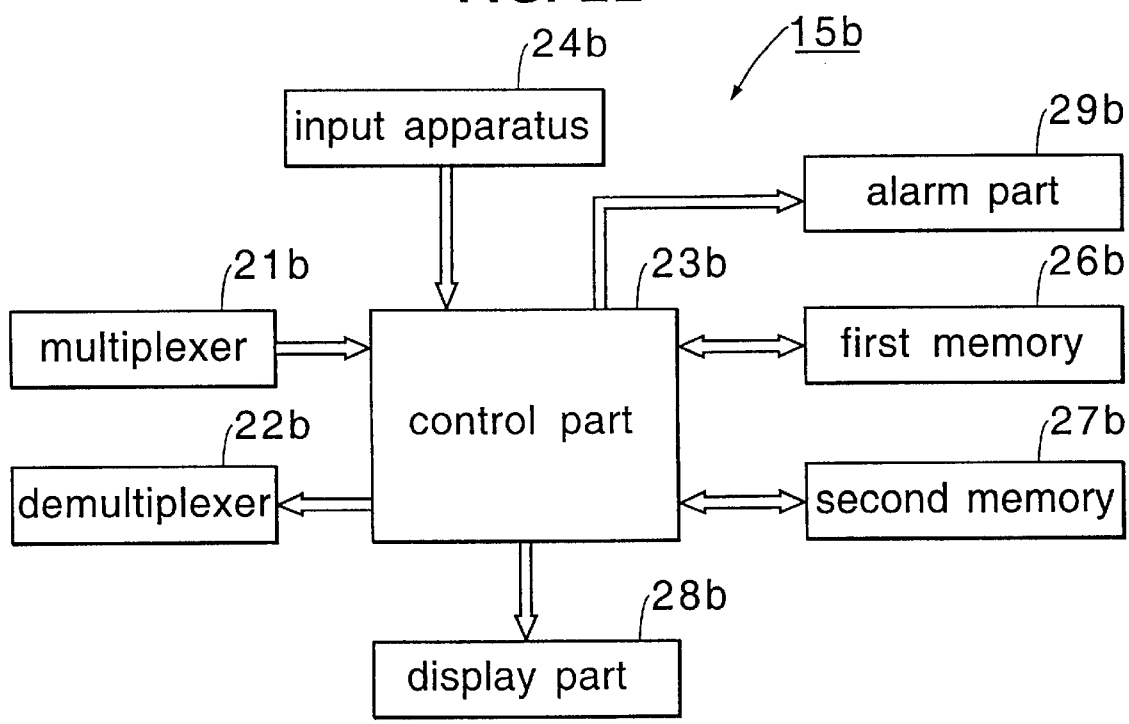

FIG. 4 schematically shows a connection of the component parts in the control means of the diagnosis system and the other units thereof according to the present invention;

FIG. 5 is a block diagram showing one embodiment of the diagnosis system and the fabrication systems, which are applicable, according to the present invention;

FIG. 6 is a block diagram showing one embodiment of the diagnosis system and the fabrication systems according to the present invention;

FIG. 7 is a block diagram showing one embodiment of an etch system with the diagnosis system according to the present invention;

FIG. 8 is a detailed block diagram showing the diagnosis system of FIG. 7;

FIG. 9 is a detailed block diagram showing the control means of FIG. 8;

FIG. 10 is a schematic circuit diagram of a part of the etching facility power supply section before being modified with the diagnosis system for the etching facility according to the present invention;

FIG. 11 is a graphical representation of the trend of the end point of the etching facility of FIG. 10;

FIG. 12 is a graphical representation of the trend of the backside-He of the etching facility of FIG. 10;

FIG. 13 is a graphical representation of the high frequency forward power $RF_{FOR}$ of the power supply section of FIG. 10;

FIG. 14 is a graphical representation of the high frequency reflective power $RF_{REF}$ of the power supply section of FIG. 10;

FIG. 15 is a graphical representation of the high frequency efficiency $RF_{EFF}$ output based on the conditions shown in FIG. 13 and FIG. 14;

FIG. 16 is a graphical representation showing the etch rate trend using the system of FIG. 10;

FIG. 17 is a schematic circuit diagram of a part of the etching facility power supply section after being modified with the diagnosis system for the etching facility according to the present invention;

FIG. 18 is a graphical representation comparing the etch rate before and after implementing shielding of the etching facility of FIG. 17;

FIG. 19 is a graphical representation of the etch rate after removing a relay from the power supply section of FIG. 17;

FIG. 20 is a diagram showing one embodiment of an exposure system with the diagnosis system according to the present invention;

FIG. 21 is a detailed block diagram showing the diagnosis system of FIG. 20; and FIG. 22 is a detailed block diagram showing the control means of FIG. 21.

Detailed Description of Preferred Embodiments

Reference will now be made in detail to preferred embodiments of the present invention, examples of which are illustrated in the accompanying drawings.

As shown in FIG. 2, the present invention comprises various fabrication systems 1 to N, a control system 20, and a diagnosis system 10. The control system 20 applies a control signal for controlling the operation of the various fabrication systems 1 to N corresponding to a sensing signal from the various fabrication systems 1 to N, or an input from a host computer (not shown). The control system 20 is connected to the various fabrication systems 1 to N for carrying out various processes including oxidation, deposition, diffusion, ion-implantation, photo-etch, etc. via a certain transmission line. The fabrication systems 1 to N send a sensing signal to the control system 20 and the diagnosis system 10 showing the state of the fabrication processes and the operating parameters (e.g., temperature, time, pressure, concentration, power, etc.), while the above fabrication processes are operating.

The diagnosis system 10 receives the control signal from the control system 20 and the sensing signal from the various fabrication systems 1 to N, and analyzes the operation state of each of the fabrication systems 1 to N.

Figure 3:
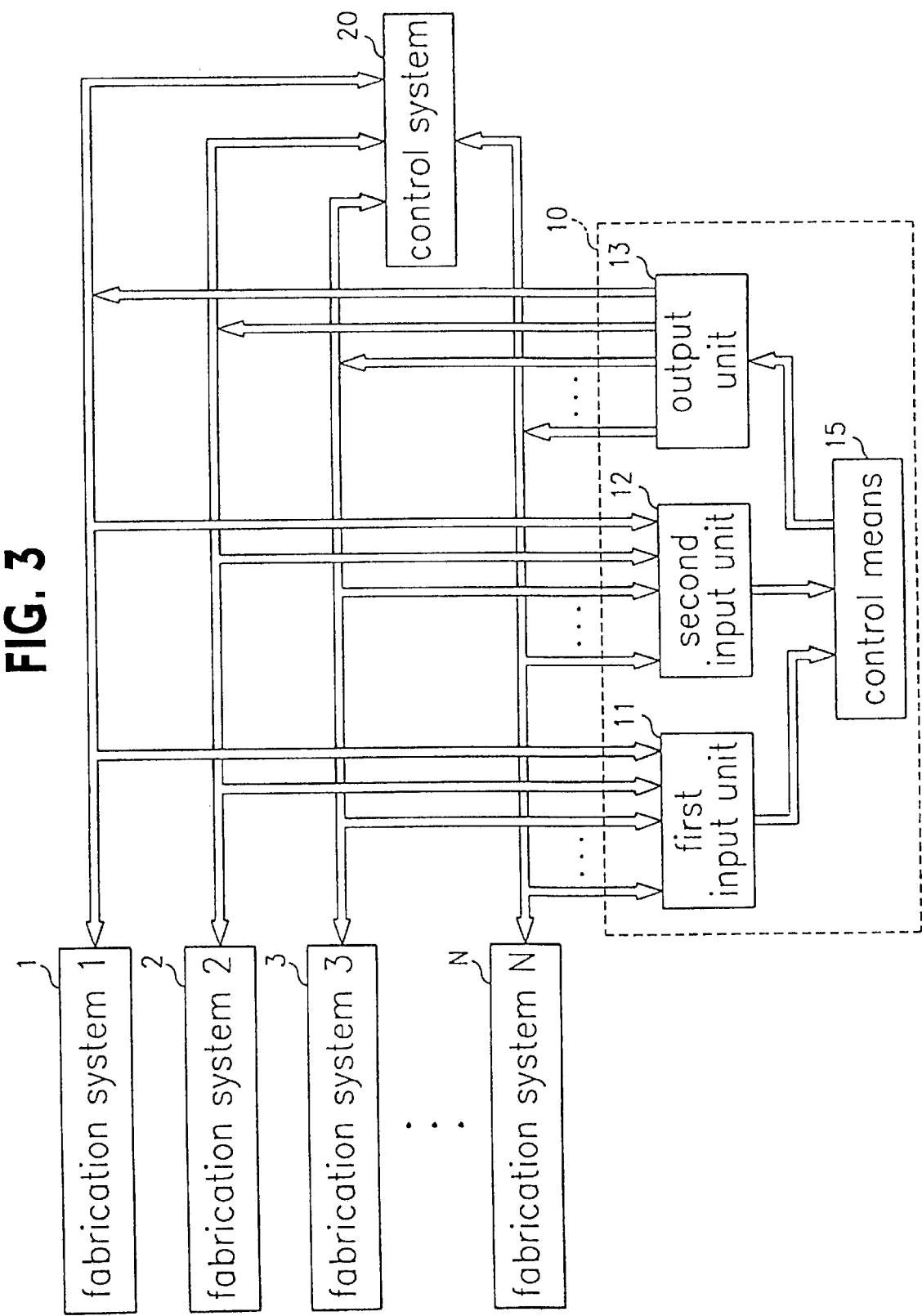
FIG. 3 is a schematic block diagram showing the connection of various fabrication systems and the diagnosis system according to the present invention.

The diagnosis system 10 for diagnosing the operation state of the various fabrication systems 1 to N, as shown in FIG. 3, comprises a first input unit 11 with a plurality of ports for receiving a sensing signal from the fabrication systems 1 to N, and a second input unit 12 with a plurality of ports for receiving a control signal from the control system 20 for controlling the fabrication processes and the operation states of the fabrication systems 1 to N. The outputs of the first input unit 11 and the second input unit 12 will be sent to a control means 15 of the diagnosis system 10. An output unit 13 connects the control means 15 and the fabrication systems 1 to N, and outputs the control signal from the control means 15 to the fabrication systems 1 to N.

The control means 15 of the diagnosis system 10 receives the sensing signal and control signal from the first input unit 11 and the second input unit 12, and analyzes the process and the operation state of the each of the fabrication systems 1 to N so as to apply a control signal for controlling the process and the operation state of the fabrication systems 1 to N to the output unit 13.

FIG. 4 shows the control means 15 in more detail. The control means 15 comprises a control part 23 for analyzing the operation state of the fabrication systems 1 to N with the sensing signal from the fabrication systems 1 to N and the control signal from the control system 20, and applies a control signal corresponding thereto. A multiplexer 21 selectively transfers the control signal from the control system 20 and the sensing signal from the fabrication systems 1 to N, which are received via the first input unit 11, and the second input unit 12, to the control part 23. A first memory device 26 stores the data for the operation state of the fabrication systems 1 to N. A display part 28 displays the operation state of the fabrication systems analyzed by the control part 23. A demultiplexer 22 selectively applies the control signal, which is output from the control part 23 corresponding to the operation state of the fabrication system, to each of the fabrication systems 1 to N. The sensing signal may be a signal output from the fabrication systems 1 to N and signals output from a specific board or a specific output port of the fabrication system.

In addition, the control means 15 further comprises a channel select part 25 for selecting at least one fabrication system among the plurality of fabrication systems 1 to N, an alarm part 29 for outputting an alarm signal in case of the occurrence of an abnormal operation state of a specific fabrication system, an input apparatus 24 for receiving programs or data from a storage medium, which stores various programs or data and is in communication with the input apparatus 24, and a second memory device 27 having a program for performing multi-tasking therein, so as to control the operation state of the fabrication systems 1 to N both by the control system 20 and the diagnosis system 10.

The diagnosis system 10, as shown in FIG. 5, is connected to the fabrication systems 1 to N through a transmission line having a connectable/disconnectable connector 90, and the diagnosis system 10 can be connected to the various fabrication systems 1 to N when necessary so as to monitor/detect the fabrication process and the operation state in the fabrication systems 1 to N.

In addition, as shown in FIG. 6, the control system 20 and the diagnosis system 10 are respectively connected to a local area network (LAN) 30 to which a communication modem 40 connected to an Internet 43 (or Wide Area Network (WAN)) is connected, so that at a remote area, the fabrication systems are monitored/controlled via the Internet 43, or a personal computer.

A diagnostic program is provided with a personal computer in order to remote-monitor/control the fabrication process and the operation state in the fabrication systems 1 to N via the Internet 43 at the remote area.

In operation, the control system 20 analyzes data from a host computer, an algorithm in the control system 20, and a sensing signal from various fabrication systems 1 to N, and outputs a control signal for controlling the fabrication systems 1 to N, each of which carries out its specific fabrication process according to the received control signal from the control system 20. The control system 20 continuously monitors and controls the operation of each of the fabrication systems 1 to N such that each of the fabrication systems 1 to N can carry out its specific process according to the particular algorithm set inside the specific fabrication system.

A sensing signal showing various fabrication parameters (e.g., pressure, temperature, voltage, gas amount, etc.), for the fabrication process being carried out in the fabrication systems 1 to N, and a control signal from the control system 20, are transferred sequentially to the multiplexer 21 through the first input unit 11. The control part 23 of the control means 15 of the diagnosis system 10 stores the information of the sensing signal in the first memory device 26. At the same time, the control part 23 analyzes the fabrication process and the operation of the fabrication systems 1 to N, and displays the results in the display part 28 with at least one of values, graphs, waveforms, text, diagrams, and the like.

The control part 23 stores and displays a sensing signal corresponding to the fabrication process and the operation of the fabrication systems 1 to N, and further, it stores the standard data for comparison in the memory device (not shown) corresponding to the fabrication process and the operation of the fabrication systems 1 to N. Therefore, the control part 23 determines the normal state by comparing the sensing signal with the standard data, and drives an alarm part 29 to output an alarm signal. The alarm signal notifies the operator of an abnormal operational state, and the operator can take corrective action.

Also, with the second memory device 27 having a program for performing multi-tasking therein, the control part 23 analyzes the sensing signal from the fabrication systems 1 to N, and assesses whether or not the process in the fabrication systems 1 to N is operating normally. If the fabrication process proceeds normally, the operation of the fabrication systems 1 to N is controlled under the control of the control system 20 as usual. However, if the fabrication process in the fabrication systems 1 to N is determined to be in an abnormal state, the control part 23 supplies a control signal corresponding thereto for normal operation of the fabrication systems, and selectively transmits the control signal to the fabrication systems 1 to N through the demultiplexer 22. Therefore, the fabrication process and the operation in the fabrication systems can be returned to normal by the control of the control part 23 of the diagnosis system 10.

Here, the above step is performed by connecting various storage media such as an external hard disk, a compact disk (CD), a floppy diskette, etc., having an algorithm, or various data therein for performing the step as above, with the input apparatus 24, and supplying the data or program to the control part 23.

The ranges to which the diagnosis system 10 monitors/controls the process and the operation in the fabrication systems 1 to N are determined by the control of the channel select part 25 so as to select a fabrication system to be controlled in case of the occurrence of an abnormal state.

Using a terminal such as a personal computer (not shown) having a communication modem 40 connected thereto at a remote area other than the place where the above fabrication systems 1 to N are installed, and forming a communication network being composed of the control system 20 and the diagnosis system 10, which are respectively connected to LAN 30, data transmission is possible between the personal computer and the various fabrication systems 1 to N.

Further, by installing the same algorithm as that of the diagnosis system 10 inside the personal computer, it is possible to monitor the fabrication process and the operation in the fabrication systems 1 to N at a remote area, see the results on a monitor, output an alarm signal when necessary, and control the process and the operation as well.

In addition, as another method of controlling the process at a remote area, with a terminal such as a computer connected to a communication modem 40, there is employed a communication server for data transmission between the various fabrication systems 1 to N, the control system 20, and the diagnosis system 10.

Therefore, an operator can monitor/check the operation state of the fabrication systems 1 to N at a remote area using a personal computer connected to a communication server, and output the results, if necessary, with an alarm signal, and thereby control the operation state of the fabrication systems 1 to N. Also, the operation can be controlled via the Internet 43 as well.

FIG. 7 depicts an etch system having the diagnosis function as described above with a diagnosis system therein. In FIG. 7, an etch chamber 76 carries out an etch process. A MFC (Mass Flow Controller) 71 senses/controls the amount of the process gas supplied to the etch chamber 76 under the control of a host computer or a chamber control system 70 sensing the process and the operation inside the etch chamber 76. A pressure gauge 72 senses the pressure inside the etch chamber 76, and a power supply source 73 supplies power to the etch chamber 76.

These components 71, 72, 73 are connected to the diagnosis system 74 for supplying the state of the etch chamber 76 or the control signal of the chamber control system 70 to the diagnosis system 74. The chamber control system 70 and the diagnosis system 74 are respectively connected to a LAN 75, which is connected to a communication modem 41 for allowing the LAN 75 to be in communication with a personal computer (not shown) having a diagnostic program, either directly or via the Internet 43, at a remote area by a communication network.

Referring to FIG. 8, the diagnosis system 74 comprises: a first input unit 11a with a plurality of input ports for receiving a sensing signal from the etch chamber 76 indicating the operation state of the etch chamber 76, and sending the sensing signal to a control means 15a; a second input unit 12a with a plurality of input ports for receiving a control signal from the chamber control system 70 for controlling the operation state of the etch chamber 76, and sending the control signal to the control means 15a; and an output unit 13a for outputting a control signal from the control means 15a to the etch chamber 76.

The control means 15a analyzes the sensing signal supplied from the first input unit 11 a so as to diagnose the process and the operation of the etch chamber 76, and corresponding thereto, allows the output unit 13a to output a control signal for controlling the process and the operation of the etch chamber 76.

FIG. 9 is a detailed view of the control means 15a, which comprises: a multiplexer 21a which receives a control signal from the chamber control system 70 and a sensing signal from the etch chamber 76, and selectively sends the control signal and the sensing signal to a control part 23a, the sensing signal and the control signal being received via the input units 11a, 12a; the control part 23a for analyzing the operation state of the etch chamber 76 with the sensing signal from the etch chamber 76 and the control signal from the chamber control system 70, and applying a control signal corresponding thereto; a first memory device 26a for storing the data for the operation state of the etch chamber 76; a display part 28a for displaying the operation state of the etch chamber 76 analyzed by the control part 23a with at least one of values, graphs, waveforms, text, diagrams, and the like; and a demultiplexer 22a for selectively applying the control signal, which is applied from the control part 23a corresponding to the operation state of the etch chamber 76, to the etch chamber 76. Therefore, the process and the operation of the etch chamber 76 can be monitored, diagnosed, and controlled.

The control means 15a further comprises an alarm part 29a for outputting an alarm signal in case of an abnormal operation state of the etch system, an input apparatus 24a for receiving various programs or data being connected to a storage medium (not shown) having programs or data, and a second memory device 27a having a program for performing multi-tasking therein. Therefore, the process and the operation can be controlled by both of the chamber control system 70 and the diagnosis system 74.

In operation, the chamber control system 70 analyzes a sensing signal of the operation state of the etch chamber 76 by the data supplied from a host computer, and the algorithm inside the chamber control system 70, and applies a control signal for controlling the etch chamber 76. The MFC 71, on receipt of the control signal from the chamber control system 70, controls the amount of process gases introduced into the etch chamber 76, and detects the amount of gases so as to transmit the results to the chamber control system 70 and the diagnosis system 74. In addition, the pressure gauge 72 senses the pressure inside the etch chamber 76 so as to send it to the chamber control system 70 and the diagnosis system 74. The power supply source 73 controls the power supplied to the etch chamber 76 under the control of the chamber control system 70 and transmits the sensing signal corresponding to the operation state to the chamber control system 70 and the diagnosis system 74.

Then, an etch process is carried out for a wafer introduced into the etch chamber 76 with supplied process gases, under environmental conditions including a certain pressure and power, and the chamber control system 70 continuously monitors and controls the operation in the etch chamber 76 such that the process inside the etch chamber 76 is carried out by a particular algorithm.

A sensing signal, showing the state of the process and the operating parameters inside the etch chamber 76 ((e.g., pressure, temperature, voltage, high frequency power, gas amount, EPD (Etching Point Detection), helium distribution, etc.)), and a control signal from the chamber control system 70, are transmitted to the multiplexer 21 a through input units 11a, 12a, sequentially, and the control part 23a stores these in the first memory device 26a and displays them in the display part 28a with at least one of values, graphs, waveforms, text, diagrams, and the like.

The control part 23a stores and displays the sensing signal for the state of the process and the operation inside the etch chamber 76 as above, and also, using standard data stored in a memory device (not shown), compares the sensing signal with the standard data, assesses the operation state, and applies an alarm signal through the alarm part 29a in the occurrence of an abnormal state. Accordingly, an operator sees the alarm signal and corrects the abnormal state.

In addition, when the second memory device 27a has a program for performing multi-tasking, the control part 23a analyzes the sensing signal from the etch chamber 76, and assesses whether or not the operation is being carried out normally in the etch chamber 76.

If the state of the process and the operation inside the etch chamber 76 is normal, the chamber control system 70 controls the etch chamber 76. However, if the state of the process and the operation inside the etch chamber 76 is determined to be abnormal, the control part 23a applies a control signal corresponding to the normal operation state, and the control signal is transmitted to the etch chamber 76 via a demultiplexer 22a. Accordingly, the etch chamber 76 is controlled to be operated normally by the diagnosis system 74 as above.

Here, utilization of the storage media having an algorithm for carrying out the above operation or various data, via the connection with the input apparatus 24a and the control part 23a, helps the process steps as well.

Using a terminal such as a personal computer (not shown) having a communication modem 41 connected thereto at a remote area other than the place where the etch chamber 76 is installed, and forming a communication network being composed of the chamber control system 70 and the diagnosis system 74, which are respectively connected to a LAN 75, data transmission is possible between the personal computer and the etch chamber 76.

Further, by installing the same algorithm as that of the diagnosis system 74 inside the personal computer, it is possible to monitor the fabrication process and the operation in the etch chamber 76 at a remote area, see the results using a monitor, output an alarm signal when necessary, and control the process and the operation as well.

In addition, as another method of controlling the process at a remote area, with a terminal such as a computer connected to a communication modem 41, there is employed a communication server for a data transmission between the etch chamber 76, the chamber control system 70, and the diagnosis system 74.

Therefore, an operator can monitor/check the operation state of the etch chamber 76 at a remote area using a personal computer connected with a communication server, and output the results, if necessary, with an alarm signal, and therefore, control the operation state of the etch chamber 76. Also, the operation can be controlled via an Internet 43 as well.

FIGS. 10–19 illustrate examples of why it is beneficial to analyze the process failures using the diagnosis system of the present invention.

FIG. 10 shows an etching chamber 76 connected via a feed to power supply 60 for supplying the high frequency power to the plasma etching chamber. The power supplied to the etching chamber 76 is applied through a direct current vias supply part 64 by the switching of the relay 62. Note that the wall 66 of the etching chamber is not shielded, with the ground being connected to the relay 62.

The etching results using such a power supply are shown in FIGS. 11–16. FIG. 11 shows that when the etching process is performed on the wafers supplied into the etching chamber, the EPD (Etching Point Detection), which indicates the etching process is completed, is substantially uniform and ranges from 2.5 to 3.0 volts. FIG. 12 is a graphical representation of the trend of the backside-He, which is the flow amount of helium (He) gas supplied to cool the backside of a wafer being processed and is expressed in volts. As shown in FIG. 12, stable changes are shown around 0.02 volts.

FIG. 13 is a graphical representation showing the high frequency forward power $RF_{FOR}$ of the power supply 60 of FIG. 10, which except for the last run, shows no deviation from an initial measurement value of about 1.45 volts. FIG. 14 is a graphical representation showing the high frequency reflective power $RF_{REF}$ of the power supply 60, which except for the last run again, shows stable deviation around 0.07 volts. Based on the conditions in FIGS. 13 and 14, the high frequency efficiency $RF_{EFF}$ expressed as a percentage, was measured and the results shown in FIG. 15. Note that the increasing/decreasing trend for the $RF_{EFF}$ in FIG. 15 is similar to the increasing/decreasing trend for the etch rate (Å/min) for the corresponding etching facility shown in FIG. 16. In other words, the increasing/decreasing trend for each run is identical.

The changes in the etch rate are not closely dependent on the EPD as shown in FIG. 11 or the backside-He as shown in FIG. 12. Therefore, the primary reason for the uneven etch rate is related to the high frequency power supply section 60. The present invention improves the connecting feed through the high frequency power supply 60.

FIG. 17 is a schematic circuit diagram of a modified part of the etching facility power supply 60. As shown in FIG. 17, the relay 62 that was installed on the end of the high frequency power supply has been removed, and the direct current (DC) vias 64 are directly connected to the etching chamber 76. Also, the wall 66 of the etching chamber 76 is shielded via the ground.

FIG. 18 is a graphical representation comparing the etch rate (Å/min) before and after implementing shielding of the power supply of FIG. 17. The curve (A) with no shielding shows an etch rate having a large deviation, while the curve (B) with shielding shows an etch rate with a substantially reduced deviation compared to curve (A), with curve (B) having a stable distribution around 4300Å/min.

FIG. 19 is a graphical representation of the etch rate after removing the relay 62 from the power supply, which shows a stable etch rate in the range of 4200 to 4400 Å/min.

Accordingly, by employing the diagnosis system of claim 14 of the present invention and comparing the monitored data, the fabrication systems' operations can be tested, and as result of the data analysis, the abnormal systems can be detected, thereby increasing the processing efficiency.

FIG. 20 depicts an exposure system having the diagnosis function as above with a diagnosis system therein. As shown in FIG. 20, the exposure system comprises an exposure control system 80 for outputting a control signal for controlling the exposure process and the operation of the exposure system according to a sensing signal from the exposure system or an input signal from a host computer (not shown), a driving part 83 for driving a stage 88 having a wafer 87 mounted thereon by two motors (not shown) back/forth and right/left; an aligning part 81 for aligning the wafer 87 mounted on the stage 88 to a certain location; and an exposure part 82 for carrying out an exposure process for the wafer 87 mounted on the stage 88. The aligning and exposure parts 81, 82 interact with the wafer via a lens assembly 86.

These components 81, 82, 83 are connected to a diagnosis system 84 for supplying the operation state of the exposure system or the control signal of the exposure control system 80. The exposure control system 80, and the diagnosis system 84 are respectively connected to a LAN 85, which is connected to a communication modem 42 for allowing the LAN 85 to be in communication with a personal computer (not shown) having a diagnostic program, or with the Internet 43 at a remote area by a communication network.

Referring to FIG. 21, the diagnosis system 84 comprises: a first input unit 11b with a plurality of input ports for receiving a sensing signal from the exposure system indicating the operation state of the exposure system, and sending the sensing signal to a control means 15b; a second input unit 12b with a plurality of input ports for receiving a control signal from the exposure control system 80 for controlling the operation state of the exposure system, and sending the control signal to the control means 15b; and an output unit 13b for outputting a control signal from the control means 15b to the exposure system.

The control means 15b analyzes the sensing signal supplied from the first input unit 11b so as to diagnose the process and the operation of the exposure system, and corresponding thereto, allows the output unit 13b to output a control signal for controlling the process and the operation of the exposure system.

FIG. 22 is a detailed view of the control means 15b, which comprises: a multiplexer 21b which receives a control signal from the exposure control system 80 and a sensing signal from the exposure system, and selectively sends the control signal and the sensing signal to a control part 23b, the sensing signal and the control signal being received via the input units 11b, 12b; the control part 23b for analyzing the operation state of the exposure system with the sensing signal from the exposure system and the control signal from the exposure control system 80, and applying a control signal corresponding thereto; a first memory device 26b for storing the data for the operation state of the exposure system; a display part 28b for displaying the operation state of the exposure system analyzed by the control part 23b with at least one of values, graphs, waveforms, text, diagrams, etc.; and a demultiplexer 22b for selectively applying the control signal, which is applied from the control part 23b corresponding to the operation state of the exposure system, to the exposure system.

The control means 15b further comprises an alarm part 29b for outputting an alarm signal in case of an abnormal operation state of the exposure system, an input apparatus 24b for receiving various programs, or data being connected to a storage medium having programs or data, and a second memory device 27b having a program for performing multi-tasking therein. Therefore, the process and the operation can be controlled by both of the exposure control system 80 and the diagnosis system 84.

The operation of the exposure system constructed as above is similar to the operation of the above etch system. The above systems carry out an etch process and an exposure process respectively, and each of the control systems 70, 80 outputs a control signal. The operation of the diagnosis system 84 may be carried out in a similar way, and so, the description of the diagnosis system 84 in the exposure system is omitted.

As described above, according to the present invention, the various fabrication systems for manufacturing semiconductor devices are monitored in real time, and when abnormal operation occurs, the abnormal state is detected using the monitored materials. In addition, since multi-tasking is possible in the above system monitoring, an exact assessment of the system monitoring is possible by statistical process control. In addition, the efficiency of the monitoring and controlling of the fabrication systems is very high with the formation of a communication network between the fabrication systems and the systems to control them.

Additional advantages and modifications will readily occur to those skilled in the art. Therefore, the invention in its broader aspects is not limited to the specific details, and representative devices, shown and described therein. Accordingly, various modifications may be made without departing from the spirit or scope of the general inventive concept as defined by the appended claims and their equivalents.

What is claimed is:

1. A facility for manufacturing semiconductor devices comprising:

a plurality of fabrication systems for carrying out fabrication processes for manufacturing semiconductor devices and outputting a sensing signal showing operation states of the fabrication processes;

a control system for outputting a control signal to the fabrication systems for controlling their operation states via transmit lines connected thereto according to the sensing signal from the fabrication systems or an input signal from a host computer; and a diagnosis system for analyzing the sensing signal from the fabrication systems and the control signal from the control system so as to assess the operation states of the fabrication systems.

2. The facility for manufacturing semiconductor devices according to claim 1, the diagnosis system comprising:

an input unit for receiving a sensing signal from the fabrication systems showing the operation states of the systems and a control signal from the control system;

an output unit for outputting a control signal for controlling the operation states of the fabrication systems according to the sensing signal therefrom; and a control means for analyzing the sensing signal received by the input unit, assessing the operation state of each fabrication system, and applying a control signal for controlling the fabrication system.

3. The facility for manufacturing semiconductor devices according to claim 2, the input unit comprising:

a first input unit with a plurality of input ports for receiving a sensing signal from the fabrication systems showing the operation state of the fabrication systems; and a second input unit with a plurality of input ports for receiving a control signal from the control system for controlling the operation state of the fabrication systems.

4. The facility for manufacturing semiconductor devices according to claim 2, the control means comprising:

a control part for analyzing the operation state of the fabrication systems with a sensing signal from the fabrication systems and a control signal from the control system, and applying a control signal corresponding thereto;

a multiplexer for selectively transferring the control signal from the control system and the sensing signal from the fabrication systems, which are received via the input unit, to the control part;

a first memory device for storing data for the operation state of the fabrication systems;

a display part for displaying the operation state of the fabrication systems analyzed by the control part; and a demultiplexer for selectively applying the control signal, which is applied from the control part corresponding to the operation state of the fabrication system, to the fabrication systems.

5. The facility for manufacturing semiconductor devices according to claim 4, wherein the display part displays the operation state of each of the fabrication systems using at least one of values, graphs, waveforms, text, and diagrams.

6. The facility for manufacturing semiconductor devices according to claim 4, the control means further comprising a channel select part for selecting at least one fabrication system among the plurality of fabrication systems.

7. The facility for manufacturing semiconductor devices according to claim 4, the control means further comprising an alarm part for outputting an alarm signal in case of an abnormal operation state of one of the plurality of fabrication systems.

8. The facility for manufacturing semiconductor devices according to claim 4, the control means further comprising an input apparatus for receiving programs or data from a storage medium, which stores various programs or data and is in communication with the input apparatus.

9. The facility for manufacturing semiconductor devices according to claim 4, the control means further comprising a second memory device having a program for performing multi-tasking therein so as to control the operation state of the fabrication systems both by the control system and the diagnosis system.

10. The facility for manufacturing semiconductor devices according to claim 1, wherein the diagnosis system is connected to the plurality of fabrication systems via a transmit line having a connector, which is capable of being connected and disconnected.

11. The facility for manufacturing semiconductor devices according to claim 1, wherein the control system and the diagnosis system are respectively connected to a LAN (Local Area Network) connected to a communication modem, and the fabrication systems are diagnosed via a communication network.

12. The facility for manufacturing semiconductor devices according to claim 1, wherein the control system and the diagnosis system are respectively connected to a LAN (Local Area Network) to which a communication modem connected to an Internet is connected, and the fabrication systems are diagnosed using the Internet.

13. A fabrication facility for manufacturing semiconductor devices comprising:
an etch chamber for carrying out an etch process for manufacturing semiconductor devices;
a chamber control system for outputting a control signal for controlling the etch process and operation of the etch chamber according to a sensing signal from the etch chamber and an input signal from a host computer; and
a diagnosis system for receiving a control signal, for controlling the etch process and an operation state of the etch chamber, and a sensing signal, for showing the etch process and the operation state of the etch chamber, diagnosing the etch process and the operation state of the etch chamber, and outputting a control signal to the etch chamber.

14. The fabrication facility for manufacturing semiconductor devices according to claim 13, the etch chamber comprising:
a MFC (Mass Flow Controller) for sensing and controlling an amount of process gas supplied to the etch chamber;
a pressure gauge for sensing pressure inside the etch chamber; and
a power supply source for applying a power to the etch chamber.

15. The fabrication facility for manufacturing semiconductor devices according to claim 13, the diagnosis system comprising:
an input unit for receiving a sensing signal from the etch chamber showing the operation state of the etch process and the operation state of the etch chamber and a control signal from the chamber control system;
an output unit for outputting a control signal for controlling the operation state of the etch chamber according to the sensing signal therefrom; and
a control means for analyzing the sensing signal received by the input unit, assessing the operation state of the etch chamber, and applying a control signal for controlling the etch chamber.

16. The fabrication facility for manufacturing semiconductor devices according to claim 15, the input unit comprising:
a first input unit with a plurality of input ports for receiving a sensing signal from the etch chamber showing the operation state of the etch chamber; and
a second input unit with a plurality of input ports for receiving a control signal from the chamber control system for controlling the operation state of the etch chamber.

17. The fabrication facility for manufacturing semiconductor devices according to claim 15, the control means comprising:
a control part for analyzing the operation state of the etch chamber with a sensing signal from the etch chamber and a control signal from the chamber control system, and applying a control signal according thereto;
a multiplexer for selectively transferring the control signal from the chamber control system and the sensing signal from the etch chamber, which are received via the input unit, to the control part;
a first memory device for storing data for the operation state of the etch chamber;
a display part for displaying the operation state of the etch chamber analyzed by the control part; and
a demultiplexer for selectively applying the control signal, which is applied from the control part corresponding to the operation state of the etch chamber, to the etch chamber.

18. The fabrication facility for manufacturing semiconductor devices according to claim 15, the control means further comprising an alarm part for outputting an alarm signal in case of an abnormal operation state of the etch chamber.

19. The fabrication facility for manufacturing semiconductor devices according to claim 15, the control means further comprising a second memory device having a program for performing multi-tasking therein so as to control the operation state of the etch chamber both by the chamber control system and the diagnosis system.

20. A fabrication facility for manufacturing semiconductor devices comprising:
an exposure system for carrying out an exposure process for manufacturing semiconductor devices;
an exposure control system for outputting a control signal for controlling the exposure process and an operation of the exposure system according to a sensing signal from the exposure system and an input signal from a host computer; and a diagnosis system for receiving a control signal for controlling the exposure process and the operation state of the exposure system and a sensing signal for showing the exposure process and the operation state of the exposure system, diagnosing the exposure process and the operation state of the exposure system, and outputting a control signal to the exposure system according thereto.

21. The fabrication facility for manufacturing semiconductor devices according to claim 20, the exposure system comprising:

a driving part for driving a stage having a wafer mounted thereon;

an aligning part for aligning the wafer mounted on the stage to a certain location; and an exposure part for carrying out an exposure process for the wafer mounted on the stage.

22. The fabrication facility for manufacturing semiconductor devices according to claim 20, the diagnosis system comprising:

an input unit for receiving a sensing signal from the exposure system showing an operation state of the exposure process and an operation state of the exposure system and a control signal from the exposure control system;

an output unit for outputting a control signal for controlling the operation state of the exposure system according to the sensing signal therefrom; and a control means for analyzing the sensing signal received by the input unit, assessing the operation state of the exposure system, and applying a control signal for controlling the exposure system.

23. The fabrication facility for manufacturing semiconductor devices according to claim 22, wherein the input unit comprising:

a first input unit with a plurality of input ports for receiving a sensing signal from the exposure system showing the operation state of the exposure system; and a second input unit with a plurality of input ports for receiving a control signal from the exposure control system for controlling the operation state of the exposure system.

24. The fabrication facility for manufacturing semiconductor devices according to claim 22, the control means comprising:

a control part for analyzing the operation state of the exposure system with a sensing signal from the exposure system and a control signal from the exposure control system, and applying a control signal according thereto;

a multiplexer for selectively transferring the control signal from the exposure control system and the sensing signal from the exposure system, which are received via the input unit, to the control part;

a first memory device for storing data for the operation state of the exposure system;

a display part for displaying the operation state of the exposure system analyzed by the control part; and a demultiplexer for selectively applying the control signal, which is applied from the exposure control part corresponding to the operation state of the exposure system.

25. The fabrication facility for manufacturing semiconductor devices according to claim 22, the control means further comprising an alarm part for outputting an alarm signal in case of an abnormal operation state of the exposure system.

26. The fabrication facility for manufacturing semiconductor devices according to claim 22, the control means further comprising a second memory device having a program for performing multi-tasking therein so as to control the operation state of the exposure system both by the exposure control system and the diagnosis system.

* * * * *